United States Patent
Van Roosmalen et al.

(10) Patent No.: US 7,253,354 B2
(45) Date of Patent: Aug. 7, 2007

(54) LIQUID-CONTAINING PHOTOVOLTAIC ELEMENT

(75) Inventors: Johannes Adrianus Maria Van Roosmalen, Alkmaar (NL); Danny Roberto Mahieu, Den Helder (NL)

(73) Assignee: Stichting Energieonderzoek Centrum Nederland (NL)

( * ) Notice: Subject to any disclaimer, the term of this patent is extended or adjusted under 35 U.S.C. 154(b) by 0 days.

(21) Appl. No.: 10/515,889

(22) PCT Filed: May 21, 2003

(86) PCT No.: PCT/NL03/00376

§ 371 (c)(1),
(2), (4) Date: Jul. 27, 2005

(87) PCT Pub. No.: WO03/102986

PCT Pub. Date: Dec. 11, 2003

(65) Prior Publication Data

US 2006/0118165 A1    Jun. 8, 2006

(30) Foreign Application Priority Data

Jun. 4, 2002    (NL)    .................................... 1020744

(51) Int. Cl.
*H01G 19/08*    (2006.01)

(52) U.S. Cl. ...................... 136/252; 136/263; 136/256; 136/251; 257/431; 257/433

(58) Field of Classification Search ................ 136/252, 136/263, 256, 251; 257/431, 433
See application file for complete search history.

(56) References Cited

U.S. PATENT DOCUMENTS 4,466,009 A * 8/1984 Konishi et al. ............. 257/432

(Continued)

FOREIGN PATENT DOCUMENTS

EP    0 885 726 A1    7/1998

(Continued)

OTHER PUBLICATIONS

Spath et al, "Reproducible manufacturing of dye-sensitized solar cells on a semi-automated baseline," Progress in Photovoltaics: Research and Applications, vol. 11, pp. 207-220, published online Feb. 14, 2003.*

(Continued)

*Primary Examiner*—Kishor Mayekar
(74) *Attorney, Agent, or Firm*—Michael Bednarek; Paul, Hastings, Janofsky & Walker LLP

(57) ABSTRACT

Liquid-containing photovoltaic element, comprising a platelike work electrode and a platelike counter-electrode adhered thereto by means of a vapour and liquid-tight peripheral edge, wherein the work electrode and the counter-electrode are each formed on a flat substrate provided with an electrically conductive layer and wherein a liquid is received into a space between the work electrode, the counter-electrode and the peripheral edge, wherein a system of mutually connected electrical conductors is provided on the conductive layer of each of the substrates for the work electrode and the counter-electrode, which conductors are provided with a layer of an electrically insulating material, in which layer there is provided at least one recess for an electrical contact on a conductor, and which systems of conductors have a mirror-symmetrical form relative to each other.

21 Claims, 3 Drawing Sheets

U.S. PATENT DOCUMENTS

| | | | | |
|---|---|---|---|---|
| 4,847,669 A | * | 7/1989 | Yamazaki et al. | 136/251 |
| 6,310,282 B1 | | 10/2001 | Sakurai et al. | 136/263 |
| 6,462,266 B1 | * | 10/2002 | Kurth | 136/251 |
| 2001/0004901 A1 | | 6/2001 | Yamanaka et al. | 136/263 |
| 2003/0140963 A1 | * | 7/2003 | Yamanaka et al. | 136/263 |
| 2004/0238026 A1 | * | 12/2004 | Miyoshi | 136/263 |

FOREIGN PATENT DOCUMENTS

| | | |
|---|---|---|
| JP | 3-269520 A * | 12/1991 |
| WO | WO 96/29715 | 9/1996 |
| WO | WO 00/48212 | 8/2000 |

OTHER PUBLICATIONS

Copy of international search report, dated Aug. 6, 2003.

* cited by examiner

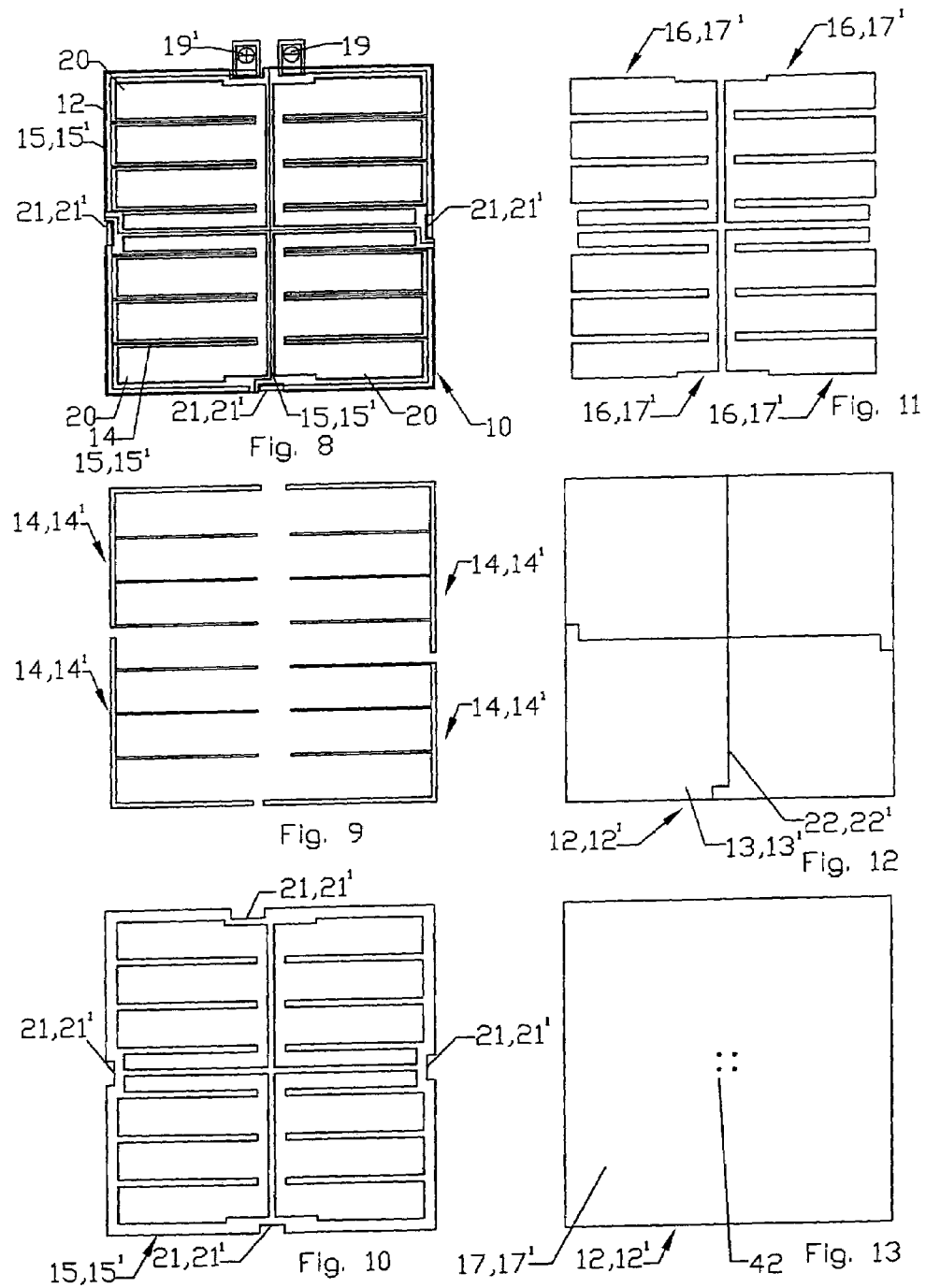

LIQUID-CONTAINING PHOTOVOLTAIC ELEMENT

This application is a 35 U.S.C. 371 National Stage filing of PCT/NL03/00376 on May 21, 2003.

BACKGROUND OF THE INVENTION

The invention relates to a liquid-containing photovoltaic element, comprising at least a plate-like work electrode and a plate-like counter-electrode adhered thereto by means of a vapour and liquid-tight peripheral edge, wherein a liquid is received in a space between the work electrode, the counter-electrode and the peripheral edge.

Such a liquid-containing photovoltaic element is known from the European patent application EP-A-0855726. The known photovoltaic element comprises a work electrode which is formed by a layered structure of at least a first electrically conductive layer which is deposited on a first substrate, a layer of nanocrystalline metal oxide semiconductor material deposited on the first electrically conductive layer, a counter-electrode which is formed by a transparent second electrically conductive layer deposited on a transparent second substrate, and an electrolytic liquid contained between the layer of semiconductor material and the second electrically conductive layer. In practical situations use is usually made of a glass plate for the first and second substrate.

It is a drawback of the known liquid-containing photovoltaic element that the contacts for drawing current from the element are arranged on edge zones of the element, wherein in all cases a first edge zone on a first substrate on which is formed a first contact does not extend opposite the second substrate, and vice versa, a second edge zone on a second substrate on which is formed a second contact does not extend opposite the first substrate. The substrate for the work electrode and the substrate for the counter-electrode in the known liquid-containing photovoltaic element are offset relative to each other so as to provide space for the electrical contacts. Offsetting of the substrates relative to each other results in a reduction of the available effective surface of the photovoltaic element, and thereby in a decrease, proportional to that reduction, in the maximum power of this element.

SUMMARY OF THE INVENTION

It is an object of the invention to provide a liquid-containing photovoltaic element in which the electrical contacts are arranged in a manner such that the substrates for work electrode and counter-electrode cover each other completely.

It is a further object to provide such an element, the work electrode and counter-electrode of which are mutually connected in effective and durable manner and into which the electrolytic liquid is introduced in simple manner.

These objects are achieved with a liquid-containing photovoltaic element of the type stated in the preamble, wherein according to the invention a system of mutually connected electrical conductors is provided on the conductive layer of each of the substrates for the work electrode and the counter-electrode, which conductors are provided with a layer of an electrically insulating material, in which layer there is provided at least one recess for an electrical contact on a conductor, and which systems of conductors have a mirror-symmetrical form relative to each other.

A photovoltaic element according to the invention provides the option of arranging the contacts ("tabs") for drawing current from the element on edge zones of the element, without it being required for this purpose that the substrate for the work electrode and the substrate for the counter-electrode are offset relative to each other. The mirror-symmetrical form of the conductor systems implies that the surfaces between the conductors, on respectively the work electrode (with the layer of semiconductor material) and the counter-electrode, also have a mirror-symmetrical form. In a photovoltaic element in which the systems of conductors on respectively the work electrode and the counter-electrode are opposite, the parts with a layer of semiconductor material and corresponding parts on the work electrode are also opposite, which enhances the efficiency of a photovoltaic element.

The systems of conductors on the respective electrodes preferably have a congruent form so that during the manufacture of the work electrode and the counter-electrode use can be made of one type of substrate, which is provided with an electrically conductive layer on which the system of mutually connected electrical conductors is provided.

In an embodiment of a photovoltaic element according to the invention, the electrically insulating material is an adhesive material, for instance a hot-melting plastic material.

A photovoltaic element, of which the conductors on the opposite electrodes are provided with a layer of adhesive material, can be manufactured in simple and cost-saving manner by placing the opposing adhesive layers into adhesive and sealing contact with each other. A thus manufactured element moreover provides the advantage that it is particularly stable and robust mechanically.

In yet another embodiment of a photovoltaic element according to the invention, the electrical conductors in each of the systems are mutually connected on at least a part of an edge zone of the respective substrates for the work electrode and the counter-electrode.

This embodiment provides the option of forming a plurality of photovoltaic cells on two common, opposed substrates, wherein a contact for drawing current can be arranged in each case on the part of an edge zone where the conductors are mutually connected.

In a subsequent embodiment the electrical conductors in each of the systems are mutually connected on an edge zone extending over the periphery of the respective substrates for the work electrode and the counter-electrode.

In this embodiment one photovoltaic cell is formed on two opposite substrates, wherein a contact can be provided on each of the substrates at a position on the edge zone which can be freely chosen.

The substrates for respectively the work electrode and the counter-electrode preferably have a mirror-symmetrical form relative to each other, more preferably the form of a rectangle or a regular polygon, most preferably a square form.

A photovoltaic element with square substrates can be manufactured in particularly effective manner and thereby at relatively low cost, and using corresponding elements can be assembled into photovoltaic panels.

In a practically advantageous embodiment, the conductors extend in parallel manner from an edge zone over a distance which is smaller than half the width of the substrates.

A photovoltaic element according to this latter embodiment provides particular advantages during manufacture thereof, since the space between the respective electrodes in an element with such conductors can be filled in rapid manner with electrolytic liquid. Filling takes place for instance by arranging a temporary filling opening in the centre of one of the substrates, placing the element on a rotatable disc, wherein the filling opening coincides with the rotation axis of the disc, and carrying the liquid into said space via the filling opening while simultaneously rotating the disc, in which space the liquid is driven in radial direction under the influence of the centrifugal force.

The invention is elucidated hereinbelow on the basis of an embodiment, with reference to the drawings.

BRIEF DESCRIPTION OF THE DRAWINGS

In the drawings

FIG. 8 shows a top view of a second embodiment of a photovoltaic element according to the invention, FIG. 9 is a top view of a pattern of conductors in the element shown in FIG. 8, FIG. 10 is a top view of a pattern of a sealing foil in the element shown in FIG. 8, FIG. 11 is a top view of a pattern of layers formed on the substrates for work electrode and counter-electrode in the element shown in FIG. 8, FIG. 12 is a top view of the substrate for the work electrodes and the counter-electrodes, provided with respectively a TCO layer, of the element shown in FIG. 8, and FIG. 13 is a top view of the counter-electrode of the element shown in FIG. 8 during a production phase.

Corresponding components are designated in the drawings with the same reference numerals. It is noted that for the sake of clarity components are not shown to the correct relative scale.

DESCRIPTION OF THE REFERRED EMBODIMENTS

Figure 1:
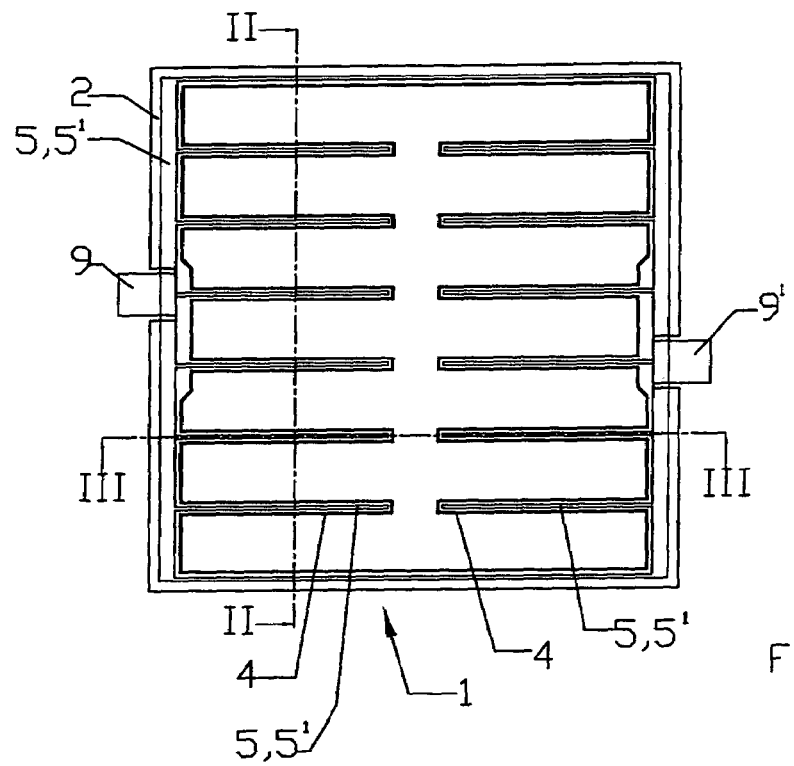
FIG. 1 shows a top view of a first embodiment of a photovoltaic element according to the invention.
Figure 2:
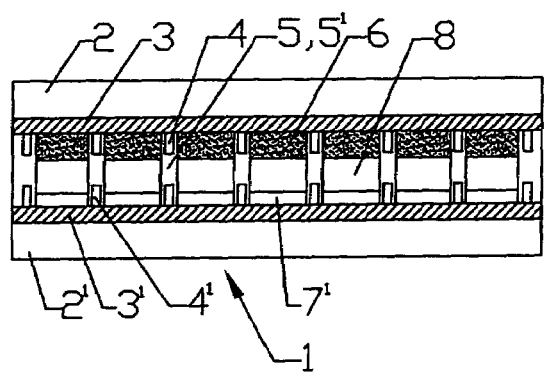
FIG. 2 shows the element depicted in FIG. 1 in a first vertical cross-section along line II—II in FIG. 1.
Figure 3:
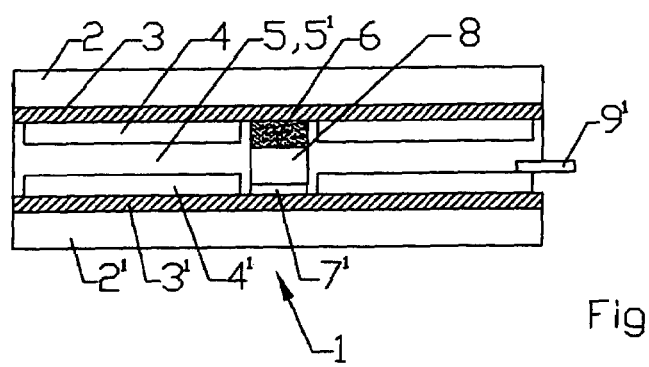
FIG. 3 shows the element depicted in FIG. 1 in a second vertical cross-section along line III—III in FIG. 1.

FIGS. 1, 2, 3 show a liquid-containing photovoltaic element 1 which is assembled from square glass plates 2, 2', on which are successively arranged a TCO layer 3, 3' of the transparent conducting tin dioxide ($SnO_2$:F) doped with fluorine and a pattern of silver (Ag) conductors 4, 4' which are covered by insulating layers 5, 5', fused to form a layer, of a hot-melting polymer foil, for instance a product commercially available from DuPont under the brand name Surlyn®. On the upper glass plate 2, 3, 4 a pattern 6 of dye-sensitized nanocrystalline titanium dioxide ($TiO_2$) is arranged between the insulated Ag conductors 4, on lower glass plate 2', 3', 4' a pattern 7 of a thin layer of platinum (Pt) is arranged between the insulated Ag conductors 4'. The upper substrate 2 with TCO layer 3, Ag pattern 4 and $TiO_2$ pattern 6 forms the work electrode, the lower substrate 2' with TCO layer 3', Ag pattern 4' and Pt pattern 7' forms the counter-electrode. In the space between work electrode and counter-electrode there is received an electrolytic liquid 8 of for instance a lithium iodide-iodine solution (LiI-I). The Ag conductors 4, 4' are mutually connected by respective conductors which extend along the periphery and on which tabs 9, 9' are arranged for drawing current from element 1.

Figure 4:
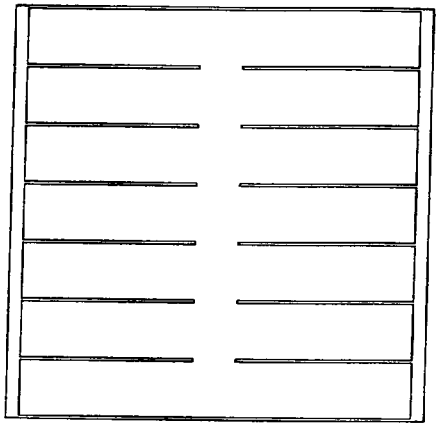
FIG. 4 shows in top view a pattern of conductors in the element shown in FIG. 1.

FIG. 4 shows a pattern of Ag conductors 4, 4' on respectively the work electrode and the counter-electrode of the element 1 shown in FIG. 1. Patterns of Ag conductors 4, 4' on the work electrode and the counter-electrode are mirror-symmetrical and congruent, and are mutually connected on an edge zone extending along the whole periphery of the respective substrate 2, 2', wherein conductors 4, 4' extend in parallel manner from an edge zone over a distance which is smaller than half the width of substrates 2, 2'.

Figure 5:
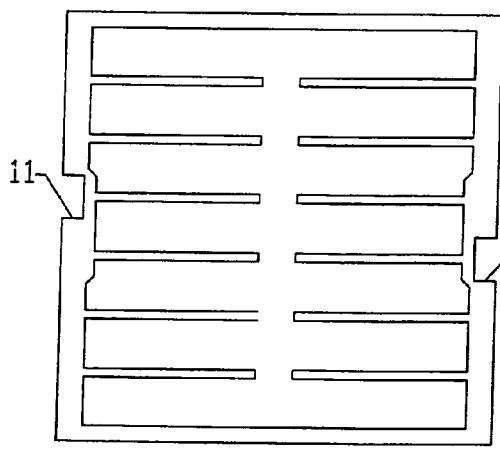
FIG. 5 shows in top view a pattern of a sealing foil in the element shown in FIG. 1.

FIG. 5 shows a pattern of a sealing foil 5, 5', in which recesses 11, 11' are arranged for respective tabs 9, 9' in a manner such that a tab 9 arranged on a work electrode is left clear by foil 5 over the conductors 4 on that work electrode and is covered by foil 5' over the conductors 4' on the counter-electrode, and a tab 9' arranged on a counter-electrode is left clear by foil 5' over the conductors 4' on that counter-electrode and is covered by foil 5 over the conductors 4 on the work electrode.

Figure 6:
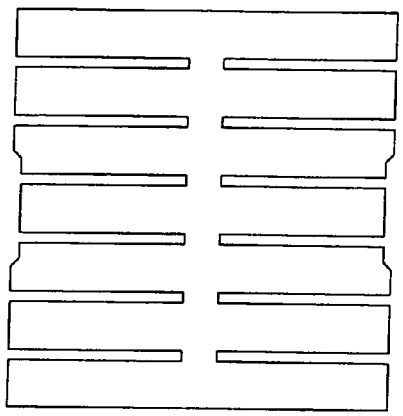
FIG. 6 is a top view of a pattern of layers formed on the substrates for work electrode and counter-electrode in the element shown in FIG. 1.

FIG. 6 shows the pattern of the $TiO_2$ layer 6 and the Pt layer 7', which is mirror-symmetrical and congruent therewith, on the substrates 2, 2' for respectively the work electrode and counter-electrode.

Figure 7:
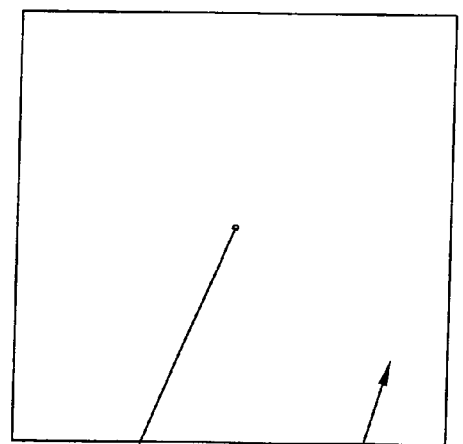
FIG. 7 is a top view of the counter-electrode of the element shown in FIG. 1 during a production phase.

FIG. 7 shows the counter-electrode (substrate 2', dimensions 10 cm×10 cm with Pt layer 7') during a phase in the production process prior to filling of the element with liquid, provided with a centrally placed filling opening 32 to be sealed after filling. The central placement of filling opening 32 and placing of conductors 4, 4', which extend in parallel manner from an edge zone over a distance which is smaller than half the width of substrates 2, 2', make it possible to introduce liquid into the space between work electrode and counter-electrode under the influence of a centrifugal force directed radially from filling opening 32.

FIG. 8 shows a liquid-containing photovoltaic element 10 assembled from four photovoltaic monocells 20 which are connected in series and which are made on quadrants of common square glass plates 12, 12' on which are successively arranged a TCO layer 13, 13' of $SnO_2$:F and respective patterns of Ag conductors 14, 14', which are covered by insulating layers 15, 15' of a hot-melting polymer foil which are fused into respective layers. On upper glass plate 12, respective patterns 16 of dye-sensitized nanocrystalline $TiO_2$ are arranged between the insulated Ag conductors 14, on lower glass plate 12', respective patterns 17 of a thin layer of Pt are arranged between the insulated Ag conductors 14'. The respective TCO layers 13, Ag patterns 14 and $TiO_2$ patterns 16 on upper substrate 12 form the respective work electrodes, the respective TCO layers 13' Ag patterns 14' and Pt patterns 17' on lower substrate 12' form the respective counter-electrodes. An electrolytic liquid is received in the spaces between the respective work electrodes and counter-electrodes. Ag conductors 14, 14' are mutually connected by respective conductors which extend along a part of the periphery and on which are arranged connections (not shown) between the individual monocells 20 for connecting in series thereof and tabs 19, 19' for drawing current from element 10.

FIG. 9 shows patterns of Ag conductors 14, 14' on respectively the work electrodes and the counter-electrodes of monocells 20 of the element 10 shown in FIG. 8. The patterns of Ag conductors 14, 14' on the work electrode and the counter-electrode are separate for each monocell and mirror-symmetrical for element 10, and are mutually connected on an edge zone extending along a part of the periphery of the respective substrates, wherein the conductors extend in parallel manner from an edge zone over a distance which is smaller than half the width of the substrates.

FIG. 10 shows a pattern of a sealing foil 15, 15' in which are arranged recesses 21, 21' for respective series connections (not shown) and respective tabs 19, 19' in a manner such that a tab 19 arranged on a work electrode is left clear by the foil 15 over conductors 14 on that work electrode, and is covered by the foil 15' over conductors 14' on the counter-electrode, and a tab 19' arranged on a counter-electrode is left clear by the foil 15' over conductors 14' on that counter-electrode, and is covered by foil 15 over conductors 14 on the work electrode.

FIG. 11 shows the pattern of the respective TiO$_2$ layers 16 and, mirror-symmetrical and congruent therewith, the Pt layers 17' on the substrates for respectively the work electrodes and counter-electrodes.

FIG. 12 shows substrate 12, 12' for the respective work electrodes and the counter-electrodes, provided with a TCO layer 13, 13' in which electrical insulation grooves 23, 23' are arranged between monocells 20 using a laser, and FIG. 13 shows the counter-electrodes (substrate 12', dimensions 30 cm×30 cm with Pt layer 17') during a phase in the production process prior to filling of the element with liquid, provided with four centrally placed filling openings 42 to be sealed after filling. The central placement of filling openings 42 and the placing of conductors 14, 14', which extend in parallel manner from an edge zone over a distance which is smaller than half the width of substrates 12, 12', make it possible to introduce liquid into the spaces between the respective work electrodes and counter-electrodes of monocells 20 under the influence of a centrifugal force directed radially from filling openings 42.

The invention claimed is:

1. Liquid-containing photovoltaic element (1; 10, 20), comprising a plate work electrode and a plate counter-electrode adhered to the work electrode by means of a vapour and liquid-tight peripheral edge, wherein the work electrode and the counter-electrode are each formed on a flat substrate (2, 2'; 12, 12') provided with an electrically conductive layer (3, 3'; 13, 13') and wherein a liquid (8) is received into a space between the work electrode, the counter-electrode and the peripheral edge, characterized in that a system of mutually connected electrical conductors (4, 4'; 14, 14') is provided on the conductive layer (3, 3'; 13, 13') of each of the substrates (2, 2'; 12, 12') for the work electrode and the counter-electrode, which conductors (4, 4'; 14, 14') have a mirror-symmetrical form relative to each other and are provided with a layer (5, 5'; 15, 15') of an electrically insulating material, which layer (5, 5') electrically isolates the conductors (4, 4') and provides the vapour and liquid-tight peripheral edge, in which layer (5, 5'; 15, 15') there is provided at least one recess (11, 11'; 21, 21') for an electrical contact (9, 9'; 19, 19') on a conductor of the conductors (4, 4'; 14, 14') in a manner such that the electrical contact (9, 9': 19, 19') is left clear by the electrically insulating material over the conductors (4, 4': 14, 14') so that it contacts the conductor of the conductors.

2. Liquid-containing photovoltaic element (1; 10, 20) as claimed in claim 1, characterized in that the systems of conductors (4, 4'; 14, 14') on the respective electrodes have a congruent form.

3. Liquid-containing photovoltaic element (1; 10, 20) as claimed in claim 1, characterized in that the electrically insulating material is an adhesive material (5, 5'; 15, 15').

4. Liquid-containing photovoltaic element (1; 10, 20) as claimed in claim 3, characterized in that the adhesive material is hot-melting plastic material (5, 5'; 15, 15').

5. Liquid-containing photovoltaic element (1; 10, 20) as claimed in claim 1, characterized in that the electrical conductors (4, 4'; 14, 14') in each of the systems are mutually connected on at least a part of an edge zone of the respective substrates (2, 2'; 12, 12') for the work electrode and the counter-electrode.

6. Liquid-containing photovoltaic element (1) as claimed in claim 5, characterized in that the electrical conductors (4, 4') in each of the systems are mutually connected on an edge zone extending over the periphery of the respective substrates (2, 2') for the work electrode and the counter-electrode.

7. Liquid-containing photovoltaic element (1; 10, 20) as claimed in claim 1, characterized in that the substrates (2, 2'; 12, 12') for respectively the work electrode and the counter-electrode have a mirror-symmetrical form relative to each other.

8. Liquid-containing photovoltaic element (1; 10, 20) as claimed in claim 7, characterized in that the substrates (2, 2'; 12, 12') take the form of a regular polygon.

9. Liquid-containing photovoltaic element (1; 10, 20) as claimed in claim 8, characterized in that the substrates (2, 2'; 12, 12') have a square form.

10. Liquid-containing photovoltaic element (1; 10, 20) as claimed in claim 9, characterized in that the conductors (4, 4'; 14, 14') extend in parallel manner from an edge zone of the respective substrates (2, 2'; 12, 12') over a distance which is smaller than half the width of said substrates (2, 2'; 12, 12').

11. Liquid-containing photovoltaic element as claimed in claim 7, characterized in that the substrates take a rectangular form.

12. Liquid-containing photovoltaic element (1; 10, 20), comprising a plate work electrode and a plate counter-electrode adhered thereto by means of a vapour and liquid-tight peripheral edge, wherein the work electrode and the counter-electrode are each formed on a flat substrate (2, 2'; 12, 12') provided with an electrically conductive layer (3, 3'; 13, 13') and wherein a liquid (8) is received into a space between the work electrode, the counter-electrode and the peripheral edge, characterized in that a system of mutually connected electrical conductors (4, 4'; 14, 14') is provided on the conductive layer (3, 3'; 13, 13') of each of the substrates (2, 2'; 12, 12') for the work electrode and the counter-electrode, which conductors (4, 4'; 14, 14') have a mirror-symmetrical form relative to each other and are provided with a layer (5, 5'; 15, 15') of an electrically insulating material, which layer (5, 5') electrically isolates the conductors (4, 4') and provides the vapour and liquid-tight peripheral edge, in which layer (5, 5'; 15, 15') there is provided at least one recess (11, 11'; 21, 21') for an electrical contact (9, 9'; 19, 19') on a conductor of the conductors (4, 4'; 14, 14') in a manner such that the electrical contact (9, 9': 19, 19') is left clear by the electrically insulating material over the conductors (4, 4': 14, 14') so that it contacts the conductor of the conductors, and in that the electrically insulating material is an adhesive material (5, 5'; 15, 15').

13. Liquid-containing photovoltaic element (1; 10, 20) as claimed in claim 12, characterized in that the adhesive material is a hot-melting plastic material (5, 5'; 15, 15').

14. Liquid-containing photovoltaic element (1; 10, 20) as claimed in claim 12, characterized in that the systems of conductors (4, 4'; 14, 14') on the respective electrodes have a congruent form.

15. Liquid-containing photovoltaic element (1; 10, 20) as claimed in claim 12, characterized in that the electrical conductors (4, 4'; 14, 14') in each of the systems are mutually connected on at least a part of an edge zone of the respective substrates (2, 2'; 12, 12') for the work electrode and the counter-electrode.

16. Liquid-containing photovoltaic element (1) as claimed in claim 15, characterized in that the electrical conductors (4, 4') in each of the systems are mutually connected on an edge zone extending over the periphery of the respective substrates (2, 2') for the work electrode and the counter-electrode.

17. Liquid-containing photovoltaic element (1; 10, 20) as claimed in claim 12, characterized in that the substrates (2, 2'; 12, 12') for respectively the work electrode and the counter-electrode have a mirror-symmetrical form relative to each other.

18. Liquid-containing photovoltaic element (1; 10, 20) as claimed in claim 17, characterized in that the substrates (2, 2'; 12, 12') take the form of a regular polygon.

19. Liquid-containing photovoltaic element (1; 10, 20) as claimed in claim 18, characterized in that the substrates (2, 2'; 12, 12') have a square form.

20. Liquid-containing photovoltaic element as claimed in claim 17, characterized in that the substrates take a rectangular form.

21. Liquid-containing photovoltaic element (1; 10, 20) as claimed in claim 20, characterized in that the conductors (4, 4'; 14, 14') extend in parallel manner from an edge zone of the respective substrates (2, 2'; 12, 12') over a distance which is smaller than half the width of said substrates (2, 2'; 12, 12').

* * * * *